United States Patent [19]

Knickerbocker et al.

[11] Patent Number: 5,293,504
[45] Date of Patent: Mar. 8, 1994

[54] MULTILAYER CERAMIC SUBSTRATE WITH CAPPED VIAS

[75] Inventors: John U. Knickerbocker, Hopewell Junction; Charles H. Perry, Poughkeepsie; Donald R. Wall, Wappingers Falls, all of N.Y.

[73] Assignee: International Business Machines Corporation, Armonk, N.Y.

[21] Appl. No.: 949,598

[22] Filed: Sep. 23, 1992

[51] Int. Cl.$^5$ .............................. H05K 1/00
[52] U.S. Cl. .................. 174/262; 174/264; 174/265
[58] Field of Search ............... 174/261, 262, 264, 265; 361/397, 414; 156/89

[56] References Cited

U.S. PATENT DOCUMENTS

| | | | |
|---|---|---|---|
| 4,234,367 | 11/1990 | Herron et al. | 156/89 |
| 4,301,324 | 11/1981 | Kumar et al. | 174/68.5 |
| 4,594,181 | 6/1986 | Siuta | 252/512 |
| 5,029,242 | 7/1991 | Sammet | 174/262 |
| 5,073,180 | 12/1991 | Farooq et al. | 65/18.4 |

OTHER PUBLICATIONS

IBM Patent Application, Ser. No. 07/758,991, filed Sep. 10, 1991, F. Y. Aoude, et al., "Copper-Based Paste Containing Copper Aluminate for Microstructural and Shrinkage Control of Copper-filled Vias".
IBM Technical Disclosure Bulletin, vol. 20, No. 9, pp. 3436-3437, Feb. 1978, R. O. Lussow, "Internal Capacitors and Resistors for Multilayer Ceramic Modules".

*Primary Examiner*—Leo P. Picard
*Assistant Examiner*—Cheryl R. Figlin
*Attorney, Agent, or Firm*—Ira David Blecker

[57] ABSTRACT

Disclosed is a multilayer ceramic substrate for electronic applications including:
(a) at least one internal layer having vias at least partially filled with a metallic material;
(b) at least one sealing layer having vias at least partially filled with a composite material that is a mixture of ceramic and metallic materials wherein at least one via from the internal layer is aligned with at least one via from the sealing layer; and
(c) a cap of material interposed between the aligned vias.

Also disclosed is a method of forming the multilayer ceramic substrate.

31 Claims, 5 Drawing Sheets

MULTILAYER CERAMIC SUBSTRATE WITH CAPPED VIAS

RELATED APPLICATION

This application is related to Knickerbocker et al. U.S. patent application Ser. No. 07/949,595, entitled "MULTILAYER CERAMIC SUBSTRATE WITH GRADED VIAS", filed Sep. 23, 1992, now U.S. Pat. No. 5,260,519.

BACKGROUND OF THE INVENTION

This invention relates to multilayer ceramic substrates, and more particularly relates to multilayer ceramic substrates useful for electronics packaging and to a method for making such substrates.

Glass, ceramic and glass ceramic (hereinafter just ceramic) structures, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, covers, etc. Interconnection between buried conductor levels can be achieved through vias formed by metal paste-filled holes in the individual ceramic layers formed prior to lamination, which, upon sintering will become a sintered dense metal interconnection of metal based conductor.

In general, conventional ceramic structures are formed from ceramic green sheets which are prepared by mixing a ceramic particulate, a thermoplastic polymeric binder, plasticizers and solvents. This composition is spread or cast into ceramic sheets or slips from which the solvents are subsequently volatilized to provide coherent and self-supporting flexible green sheets. After blanking, via formation, stacking and laminating, the green sheet laminates are eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

Present state-of-the-art ceramic substrates are made from cordierite glass-ceramic particulate materials such as that disclosed in Kumar et al., U.S. Pat. No. 4,301,324. These substrates exhibit a dielectric constant of about 5 and a thermal coefficient of expansion (TCE) that closely matches that of silicon. It is desirable to fabricate substrates out of low dielectric constant materials so as to increase signal propagation speed, which varies inversely with the square root of the dielectric constant.

Prior to the cordierite glass-ceramic materials, alumina for a number of years had been an adequate dielectric material for microelectronic packaging. Alumina, however, has a dielectric constant approaching 10 which causes high signal propagation delay and low signal-to-noise ratio. Further, alumina has a TCE about twice as high as silicon which impacts the thermal fatigue resistance of the package. For low end applications, however, alumina (as well as other similar materials having a dielectric constant of about 10 and below) will be used for some time to come.

The present inventors, however, have discovered a vexing problem that is applicable to many multilayer ceramic materials and substrates fabricated therefrom.

It has been found by others that the vias do not completely seal to the ceramic material, thereby possibly resulting in a gap between the metallic via and the ceramic bulk material. This gap is undesirable as it reduces the hermeticity of the fabricated substrate as well as allowing fluids to seep into the substrate during processing. Accordingly, it has been proposed in Farooq et al., U.S. Pat. No. 5,073,180, the disclosure of which is incorporated by reference herein, to seal at least the top layer of a multilayer ceramic substrate with a composite via material consisting of metallic and ceramic (including glass) materials. The internal vias are essentially all metal. As taught by Siuta U.S. Pat. No. 4,594,181, the internal vias may also include small amounts of alumina or other ingredients to inhibit the densification of the metallic via.

What the present inventors have found is that at the interface between the composite sealing via and the metallic internal via, and/or at the interface between the internal via and the bulk ceramic, there is a mismatch of thermal coefficients of expansion and some difference in densification behavior during cofiring which makes the interface susceptible to fatigue failure when the substrate is exposed to thermal stress during post-firing processing. The result is that an unrepairable open may occur at one of the above interfaces. If the net containing the open cannot be rerouted, the entire substrate must be scrapped.

It is, therefore, a purpose of the present invention to have a substrate which does not suffer from such thermal fatigue-enhanced opens.

It is another purpose of the present invention to have a process for making such a substrate.

These and other purposes of the present invention will become more apparent after referring to the following description of the invention considered in conjunction with the accompanying drawings.

BRIEF SUMMARY OF THE INVENTION

The purposes of the invention have been achieved by providing, according to a first aspect of the invention, a multilayer ceramic substrate for electronic applications comprising:

(a) at least one internal layer having vias at least partially filled with a metallic material;

(b) at least one sealing layer having vias at least partially filled with a composite material that is a mixture of ceramic and metallic materials wherein at least one via from the internal layer is aligned with at least one via from the sealing layer; and (c) a cap of material interposed between the aligned vias.

According to a second aspect of the invention, there is provided a method of fabricating a multilayer ceramic substrate for electronic applications, the method comprising the steps of:

providing at least one unsintered internal layer having vias at least partially filled with a metallic material;

providing at least one unsintered sealing layer having vias at least partially filled with a composite material that is a mixture of ceramic and metallic materials;

depositing a cap of material on at least one via of the internal layer or screening layer;

stacking the internal and sealing layers so that at least one via from the internal layer is aligned with at least one via from the sealing layer and the cap of material is between the aligned vias; and sintering the internal and sealing layers to form a multilayer ceramic substrate.

DETAILED DESCRIPTION OF THE INVENTION

The present invention is applicable to multilayer ceramic substrates for electronic applications. The preferred embodiment of the invention is directed to multilayer ceramic substrates comprising glass ceramic layers and copper vias. However, the present invention is believed to be applicable to other material combinations as well such as palladium, gold and silver in low fired MLC ceramics such as borosilicate glasses that include ceramic additives (so-called glass plus ceramics). As another example, alumina substrates typically have tungsten or molybdenum internal vias and tungsten or molybdenum plus glass sealing vias. There is the potential for increased stress at the interface of these two types of vias; therefore, it is believed that a transitional capping layer according to the present invention would be useful for this material combination as well.

Figure 1:
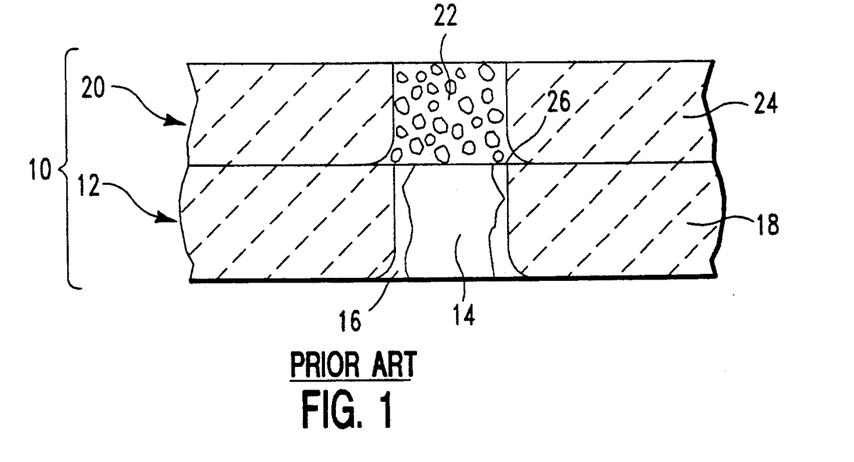
FIG. 1 is a partial cross sectional view of a prior art multilayer ceramic substrate.

Referring to the Figures in more detail and particularly referring to FIG. 1, there is shown the prior art arrangement of layers in a multilayer ceramic (hereinafter MLC) substrate 10. Internal layer 12 has vias 14 which are filled with a conductive metal. As is well known, there will usually be a plurality of such internal layers 12 as these layers carry substantially all of the internal wiring of the substrate. Further, so as to keep the resistivity of the substrate to a minimum, the vias 14 and all the wiring consist predominately of a conductive metal. It has been found that certain ceramic additives, such as alumina, or other alloying additives and/or organic additives are useful to control the densification of the conductive metal so as to more closely approximate the densification rate of the surrounding ceramic bulk. These other additives may be present from the parts per million range up to several percent depending on the function and perceived need of the additive. It is, of course, well known that increasing the amount of the inorganic additive increases the resistivity of the fired metallic conductor so it is preferred to keep these additives to a minimum. The determination of the exact composition of the vias 14 is well within the competence of a person skilled in the art.

Notwithstanding the presence of the additives, such as alumina, mentioned above, it happens that a gap 16 is formed between the via 14 and the ceramic 18. In order to avoid the intrusion of liquids during processing and to otherwise maintain the hermeticity of the substrate 10, a sealing layer 20 may be added to the substrate 10. As can be seen from FIG. 1, there is no gap between via 22 and ceramic 24. Via 22 in sealing layer 20 is a composite material made of ceramic material and conductive metal. The so-called composite via is made so as to densify during co-firing very closely to that of the ceramic 24 and is designed so as to have a thermal coefficient of expansion (TCE) approaching that of the ceramic 24. In order to accomplish this, via 22 has a very high percentage of glass, perhaps 50 volume % or more. So, while via 22 approaches the TCE of ceramic 24, the TCE of via 22 varies considerably from that of via 14.

The present inventors have found the difference in TCE between vias 14 and 22 and between via 14 and the bulk ceramic, as well as the difference in conductive metal content of the two vias, causes an increase in stress at the interface 26 between vias 14 and 22. During thermal cycling, interface 26 may become susceptible to thermal fatigue, resulting in a break in the via at or near interface 26, thereby causing an open in the electrical net of which vias 14 and 22 form a part.

The inventors have therefore proposed a transitional capping layer according to the invention between the internal layer and the sealing layer.

Figure 2:
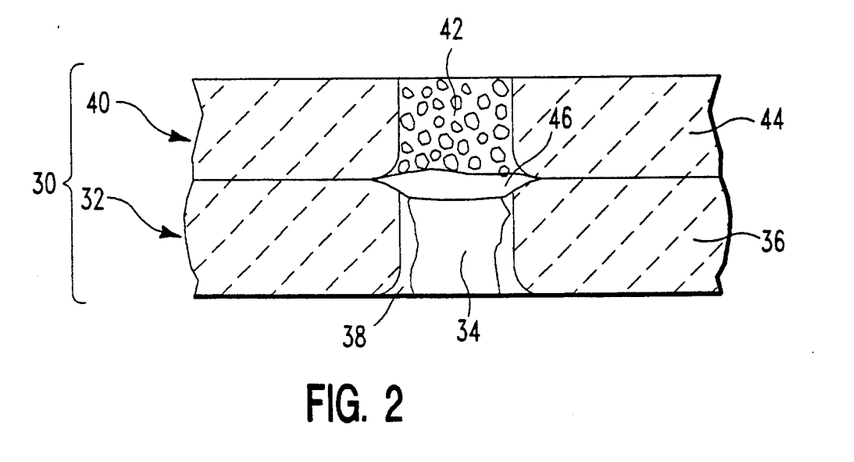
FIG. 2 is a partial cross sectional view of a first embodiment of the multilayer ceramic substrate according to the present invention wherein the cap and sealing layer are at the top of the substrate.

Referring now to FIG. 2, there is shown an MLC substrate 30 according to the present invention. The substrate 30 has at least one internal layer 32 having vias 34 at least partially filled with a metallic material. There may be a gap 38 between the via 34 and ceramic 36. Substrate 30 also has at least one sealing layer 40 having vias 42 at least partially filled with a composite material that is a mixture of ceramic and metallic materials. As expected, there is no gap between via 42 and ceramic 44 in layer 40. Via 34 is in alignment with via 42, Now, according to the invention, there is a cap 46 of material interposed between the aligned vias 34, 42. It is possible that cap 46 may protrude into one or both of aligned vias 34, 42. As shown in FIG. 2, cap 46 protrudes slightly into both vias 34, 42.

As will be explained in more detail hereafter, the cap 46 assists in making the transition between the aligned vias 34, 42.

The composition of cap 46 may vary from having the same metallic composition as via 34 to having a composition close to that of composite via 42. As noted earlier, metallic via 34 may contain certain ceramic and/or other additives to control densification and resistivity. If via 34 does contain ceramic material additives, they will be in a quantity that is much less than that present in via 42. Similarly, cap 46 may also contain small amounts of the ceramic material additives. If desired, cap 46 may also contain a mixture of metallic and ceramic materials; however, there will be less ceramic and more metallic materials than composite via 42. In the latter situation, cap 46 would also have less metallic material than metallic via 34.

While there is only one via shown in each layer for the sake of clarity, there will typically be a plurality of such vias in each layer. Further, while there is only one pair of aligned vias in layers 32, 40 with an interposed cap 46 of material, there will typically be a plurality of such aligned pairs of vias with interposed caps.

Figure 3:
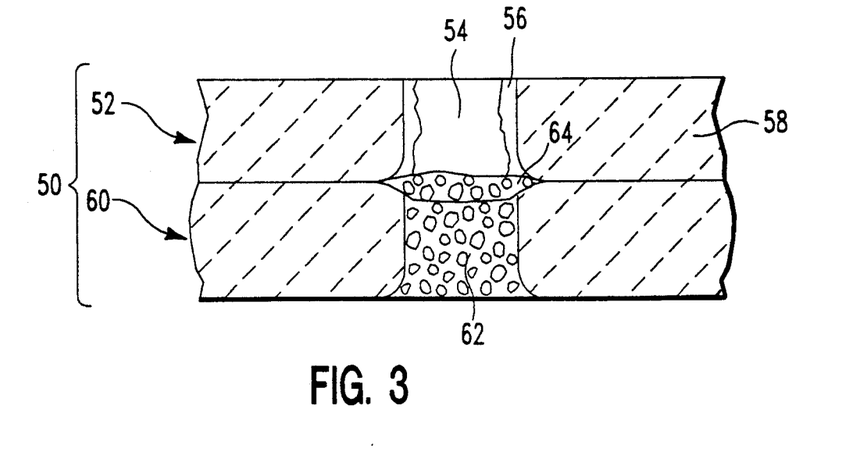
FIG. 3 is a partial cross sectional view of a second embodiment of the multilayer ceramic substrate according to the present invention wherein the cap and sealing layer are at the bottom of the substrate.

Referring now to FIG. 3, there is shown an MLC substrate 50 according to the present invention. The substrate 50 has at least one internal layer 52 having vias 54 at least partially filled with a metallic material. There may be a gap 56 between the via 54 and ceramic 58. Substrate 50 also has at least one sealing layer 60 having vias 62 at least partially filled with a composite material similarly to via 42 in substrate 30. Via 54 in internal layer 52 is aligned with via 62 in sealing layer 60. Substrate 50 has a cap 64 of material interspersed between the aligned vias 54, 62. As was the case in the FIG. 2 embodiment, cap 64 may protrude into one or both of aligned vias 54, 62.

The composition of vias 54, 62 are substantially the same as vias 34, 42 in substrate 30. The composition of cap 64, however, varies somewhat from cap 46 in substrate 30. Cap 64 is a composite material of ceramic and metallic materials. The proportions of these materials may be the same as for composite via 62. If desired, the amount of ceramic materials in cap 64 may be substantially decreased (with a corresponding increase in metallic materials) as compared to composite via 62 but will still be greater than the amount of ceramic materials in via 54.

Figure 4:
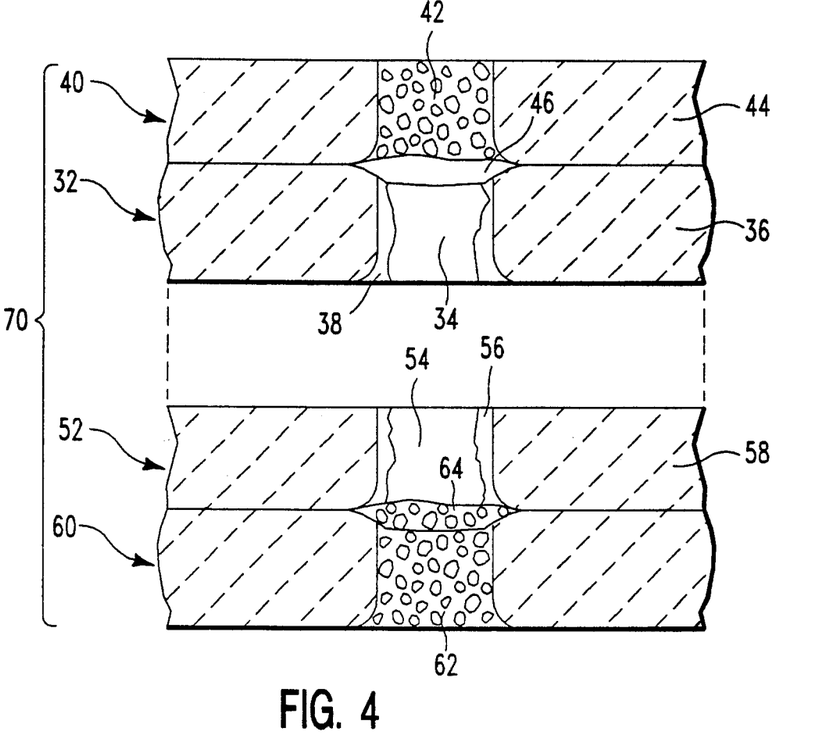
FIG. 4 is a partial cross sectional view of a multilayer ceramic substrate according to the present invention wherein a cap and sealing layer are at the top and bottom of the substrate.

Substrates 30, 50 may be suitable as stand alone products. That is, if one were interested in sealing only the top of the substrate, the substrate 30 embodiment would be utilized. On the other hand, if one were interested in sealing only the bottom of the substrate, then the substrate 50 embodiment would be utilized. In practice, both substrates 30, 50 would be combined to form a single substrate 70 as shown in FIG. 4. Thus, sealing layers 40, 60 would form the top and bottom layers, respectively, or outer periphery of the substrate. Inwardly of layers 40, 60 would be internal layers 32, 52, respectively.

There may, and usually will, be a plurality of internal layers 32, 52 as these layers carry substantially all of the internal wiring of the substrate 70. It may be desirable for there to be a plurality of sealing layers as well.

Figure 8:
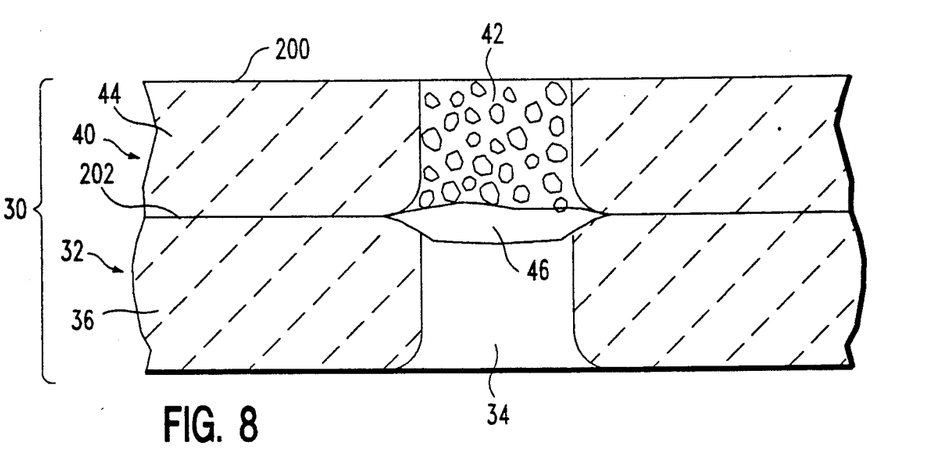
FIG. 8 is an enlarged view of FIG. 2.

The dimensions of caps 46, 64 are also important to the invention. This can best be illustrated in FIG. 8 which shows an enlarged view of substrate 30. When green ceramic sheets are perforated (such as by punching) to form vias, the breakout side of the via is usually larger than the side that first comes in contact with the punch. Thus, if layer 40 was to have been punched from side 200, then via 42 would be larger at side 202 of layer 40. Thus, that part of via 34 that aligns with via 42 is smaller in diameter than via 42. For best results, cap 46 should extend across the entire breakout dimension of via 42. As a general principle, the cap should be at least coextensive with the breakout or largest lateral dimension of the aligned vias. The cap may be larger than this dimension if desired.

Figure 9:
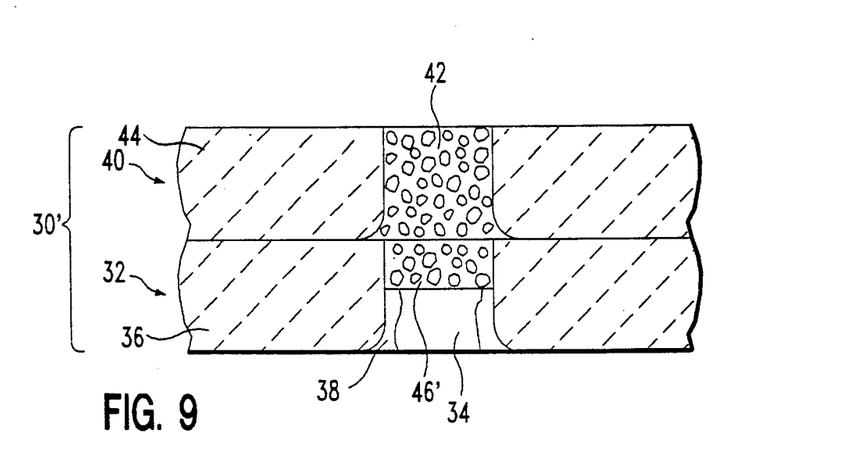
FIGS. 9 and 10 are partial cross sectional views of a multilayer ceramic substrate according to the present invention showing the cap and internal layer vias both being located in the same internal layer.
Figure 10:
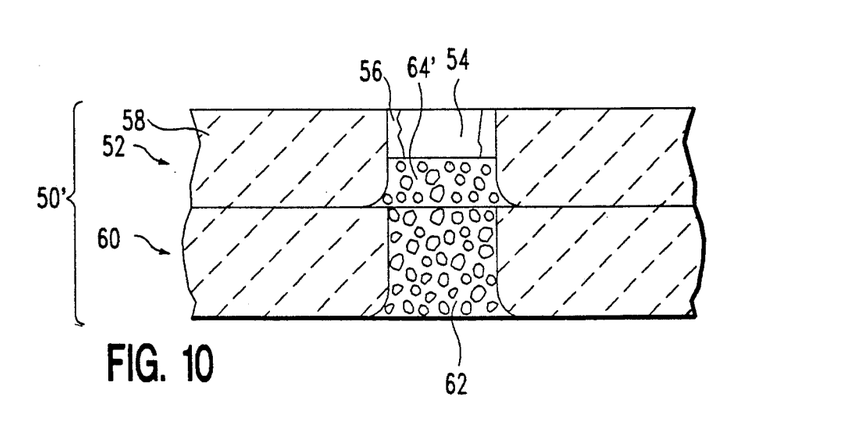

A variant of this general principle is disclosed in FIGS. 9 and 10, which are similar to FIGS. 2 and 3, respectively. In FIG. 9, via 34 has been partially filled with a metallic paste. The remainder of the via has been filled with cap 46'. In order to perform the function of the invention, cap 46' is a composite material that has less ceramic and more metallic material than the sealing layer vias 42 and less metallic material than the internal layer via 34. After sintering, gap 38 is apparent in via 34 but not in cap 46'. The layer 32 with via 34 and cap 46' may be formed by a double screening method which will be discussed in more detail with respect to FIG. 7. As to FIG. 10, via 54 is partially filled with a metallic paste and the remainder of the via is filled with cap 64'. The composition of cap 64' is the same as cap 64 of FIG. 3. The embodiments shown in FIGS. 9 and 10 are particularly advantageous where relatively thick greensheets are utilized.

The present inventors have found that by interposing the cap between the aligned vias, the stresses that would ordinarily develop at the interface between the aligned vias are markedly reduced, thereby substantially eliminating the former problem of opens.

While not wishing to be held to any particular theory, the present inventors believe that the cap works for the following reasons. Where there was one bad interface (between the sealing via and internal via), there are now two good interfaces (between sealing via and the cap and between the cap and the internal via). Of particular importance is the increase in contact area of the mating surfaces at the interface by a factor as great as 2.5. This increase in contact area reduces stress in conductive filaments bridging the interface, and subsequently extends the fatigue life of a metallurgical contact. Synergistic to this principle improvement are: (1) more effective pinning of the interface region by the rigid ceramic matrix due to its physically confined configuration; (2) opportunity to grade compositional changes between via types by using a paste for the cap of intermediate composition; and (3) additional paste is added which more adequately fills via space giving a higher density of packed metal particles locally in the unfired laminate.

Figure 5A:
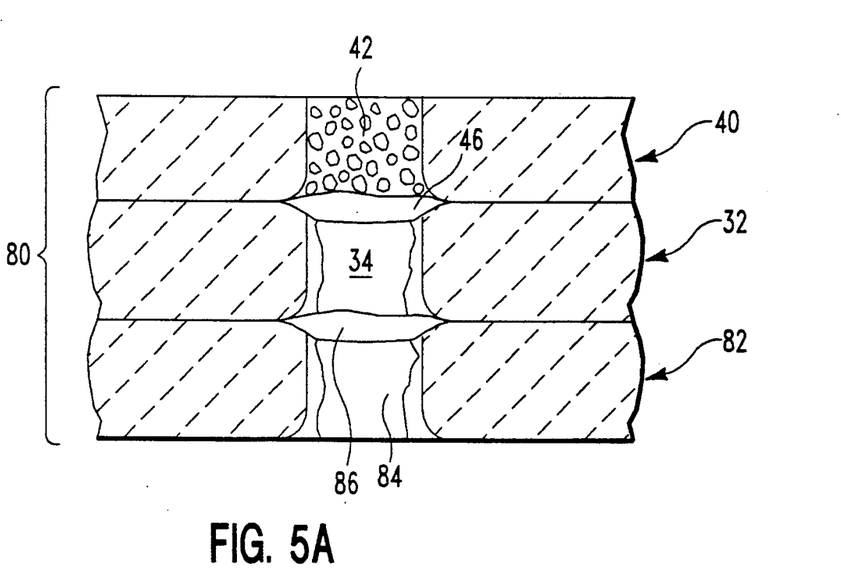
FIGS. 5A and 5B are partial cross sectional views of another embodiment of the present invention wherein the substrate comprises a plurality of caps.
Figure 5B:
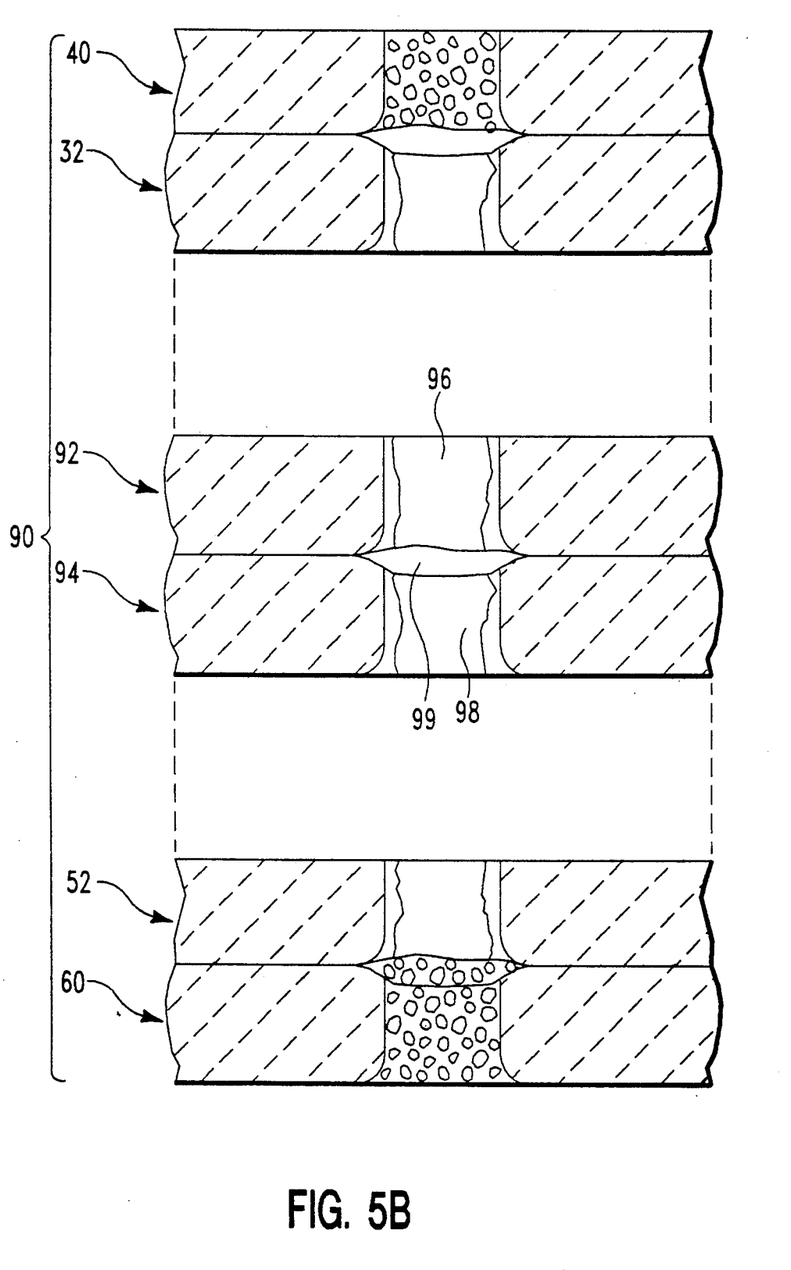

Referring now to FIG. 5A, another embodiment of the invention is illustrated. As discussed with respect to FIG. 2, there is a sealing layer 40 having a composite via 42 and an internal layer 32 having metallic via 34. Interposed between aligned vias 34, 42 is cap 46. There may be a plurality of interfaces which such a cap is desired. Thus, as shown, there is an additional internal layer 82 having a via 84. Between aligned vias 34, 84 is a cap 86, which may be selected from the materials discussed previously. In FIG. 5A, internal layer 82 is adjacent to internal layer 32. It may be desirable to separate the internal layers where the cap is interposed. That is, as shown in MLC substrate 90 of FIG. 5B, internal layer 32 and internal layer 92 are separated by at least one other internal layer and usually several internal layers. Internal layer 92 is adjacent to internal layer 94. Interposed between aligned vias 96, 98 is cap 99. Such an arrangement may be found to be useful in connecting the vias at intervals within the substrate 90.

Figure 6:
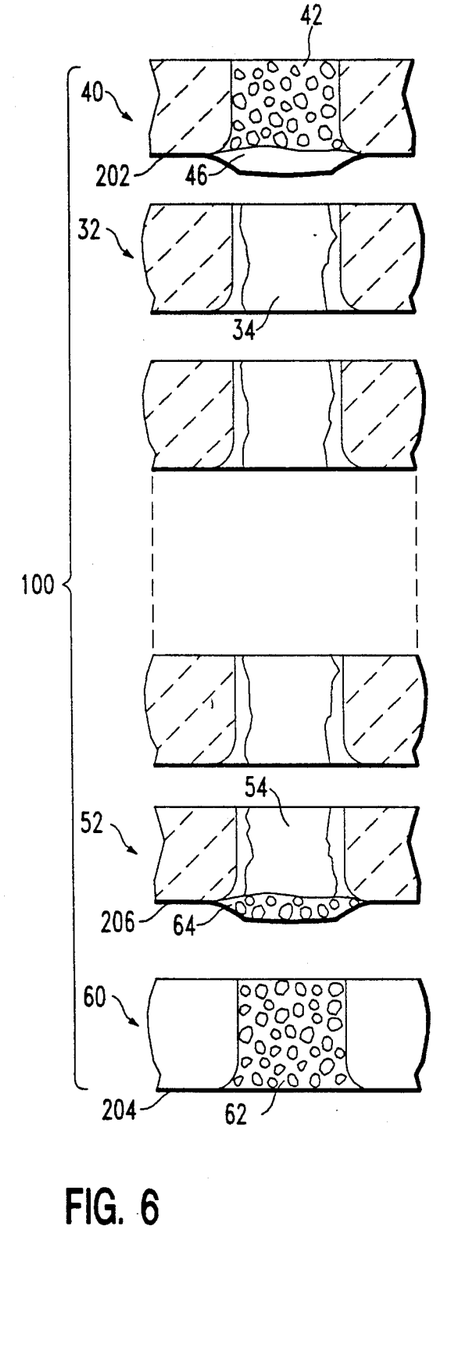
FIG. 6 is a partial cross sectional view illustrating the forming of a multilayer ceramic substrate by a two pass screening process according to the present invention.

The process of making the MLC substrates according to the present invention will now be described with reference to FIGS. 6 and 7. Referring first to FIG. 6, there is illustrated MLC substrate 100 prior to stacking of the unsintered sealing and internal layers. Sealing layer 40 has a via 42 filled with a composite via paste. Due to the operation of forming the vias, as described in detail with reference to FIG. 8, the breakout side 202 of sealing layer 40 has a larger via opening. It has been found advantageous to fill the vias (such as by a screening operation) from the breakout side. After via 42 is screened with via paste, then cap 46 is deposited by screening on the breakout side of via 42. That is, via 42 is first filled with the appropriate via composition, then the paste is changed to that of the cap material and the unsintered layer 40 is screened again. This is called two pass screening. Unsintered internal layer via 34 is similarly filled with a different via paste. Other internal layers may be formed as needed or desired. Note that cap 46 has been deposited only on via 42 of sealing layer 40.

As to the bottom of substrate 100, sealing layer 60 has via 62 filled with a composite via paste. Via 62 is filled from the breakout side 204 of sealing layer 60. Internal layer 52 has via 54 filled with a metallic paste from the breakout side 206 of the layer. Then, the paste is changed and in a second pass, cap 64 is deposited on via 54.

Thereafter, the unsintered layers are properly aligned and stacked so that the vias are aligned where necessary with caps 46, 64 interposed between their respective vias. The substrate 100 is then sintered.

Figure 7:
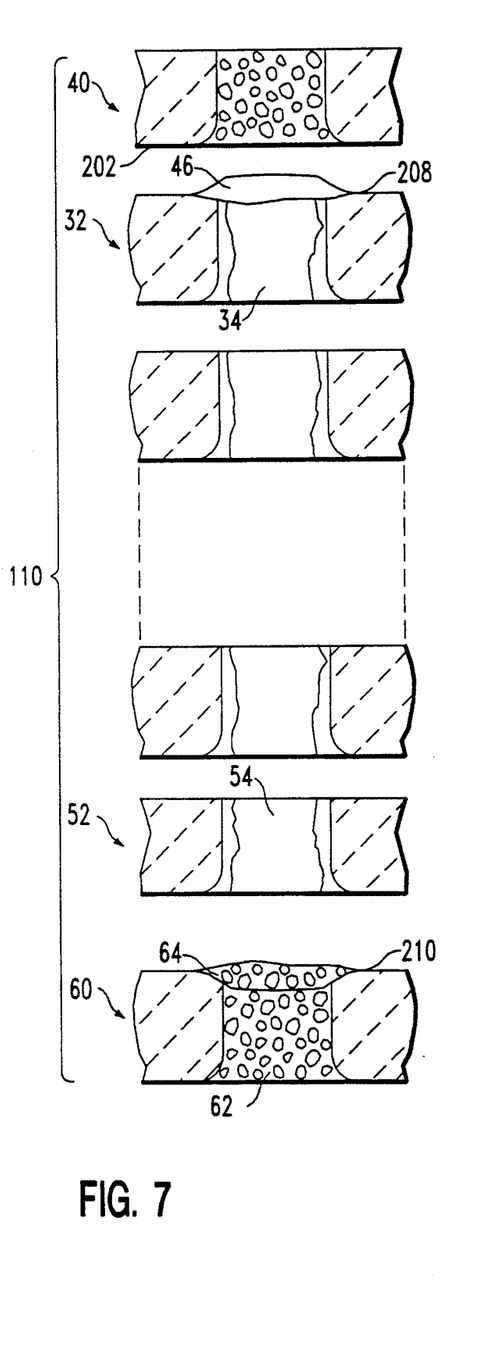
FIG. 7 is a partial cross sectional view illustrating the forming of a multilayer ceramic substrate by a double sided screening process according to the present invention.

Alternatively, the MLC substrate may be formed in a manner as illustrated in FIG. 7. Substrate 110 is formed similarly to substrate 100 of FIG. 6 except that cap 46 is now deposited on non-breakout side 208 of internal layer 32 and cap 64 is now deposited on non-breakout side 210 of sealing layer 60. As to internal layer 32 and sealing layer 60, the respective vias 34, 62 are filled from the breakout side with the appropriate via paste as previously described. The unsintered layers are dried, turned over and then the caps 46, 64 are deposited on the non-breakout side of the layers. This kind of screening procedure is called double sided screening. Thereafter, the unsintered layers are stacked and sintered as described with respect to FIG. 6.

The processes described with reference to FIGS. 6 and 7 are believed to be the best alternatives from the standpoint of efficiency, quality and cost. It is, of course, possible to combine the two processes so as to deposit some of the caps by two pass screening and some by double sided screening. Or, the caps may be deposited in portions where one portion, for example, is deposited by two pass screening on the breakout side of the top sealing layer and a second portion is deposited by double sided screening on the non-breakout side of the internal layer immediately below the sealing layer. It should be understood that these alternatives are within the scope of the present invention.

In the most preferred embodiment of the invention, the bulk ceramic making up the MLC substrate and the ceramic in the composite vias and caps may be selected from the cordierite and spodumene glass ceramic materials disclosed in the Kumar et al., U.S. Pat. No. 4,301,324 mentioned above. Other glass ceramic materials include, for example, eucryptite and anorthite. Glass ceramic materials are a recognized class of materials which begin as glasses but upon heating undergo devitrification and become at least partially crystallized. Some examples are given in Table I.

TABLE 1

| | GLASS CERAMIC COMPOSITION (WEIGHT PERCENT) | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 |
| $SiO_2$ | 55.0 | 54.5 | 54.5 | 52.3 | 57.8 | 60.0 | 50.0 | 53.9 | 54.0 | 55.0 | 60.0 | 54.5 | 57.0 | 55.0 | 47.0 | 53.9 | 54.0 | 54.5 | 54.0 | 54.0 |
| $Al_2O_3$ | 21.1 | 21.0 | 21.0 | 19.7 | 22.2 | 18.2 | 22.9 | 20.7 | 21.0 | 21.0 | 17.0 | 20.0 | 21.0 | 21.0 | 33.5 | 20.8 | 22.0 | 21.3 | 22.0 | 21.0 |
| MgO | 22.3 | 19.8 | 19.8 | 24.0 | 16.0 | 17.8 | 22.2 | 19.6 | 19.0 | 18.0 | 18.0 | 20.0 | 20.0 | 22.0 | 13.5 | 19.6 | 20.0 | 19.9 | 20.0 | 22.0 |
| $B_2O_3$ | 1.3 | 1.0 | 1.0 | 1.0 | 1.0 | 1.0 | 1.1 | 1.0 | 1.0 | 1.0 | 1.0 | 1.0 | 1.0 | 2.0 | 3.0 | 1.0 | 1.0 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 | 3.0 | 1.5 | 1.0 | | 3.0 | 2.7 | 2.0 | 2.8 | 2.0 | |
| $C_3O_2$ | | 1.0 | | | | | | | | | | | | | | | | | | |
| MnO | | | 1.0 | | | | | | | | | | | | | | | | | |
| $ZrO_2$ | | | | | | | | | 2.0 | | | | 2.0 | | | | | | | |
| CaO | | | | | | | | | | 2.0 | | | 1.0 | | | | | | | |
| NiO | | | | | | | | | | | 2.0 | | | | | | | | | |
| $Li_2O$ | | | | | | | | | | | | 1.0 | | | | | | | | |
| $Fe_2O_3$ | | | | | | | | | | | | | | | 2.0 | | | | | |
| $Na_2O$ | | | | | | | | | | | | | | | | 1.0 | | | | |
| $TiO_2$ | | | | | | | | | | | | | | | | | 1.0 | | | |
| ZnO | | | | | | | | | | | | | | | | | | 1.0 | | |
| CuO | | | | | | | | | | | | | | | | | | | 2.0 | |

The glass ceramic in the composite vias does not need to be the same as that in the bulk ceramic nor does the glass ceramic in the sealing layer vias need to be the same as the glass ceramic in the caps or the internal layer vias (if the internal layers contain a glass ceramic material, as discussed below). The choice of glass ceramic material is dictated by strength, densification characteristics and TCE. It may also be desirable to add ceramic or other additives, alumina being but one example, to assist in controlling the densification behavior of the composite vias.

The internal layer vias may also contain ceramic material to control densification and TCE. Such ceramic material may include alumina (as discussed previously) and/or glass ceramic materials. If the internal layer vias do contain ceramic materials, it should be in an amount which is much less than that present in the sealing layer vias.

It has been found that the most preferred composition of the sealing layer vias is 40 to 90 volume % glass ceramic and 60 to 10 volume % metallic material, with the most preferred metallic material being copper. The composition of the caps may vary depending on the proper balancing of reliability, resistivity and location in the substrate. That is, when the caps are at the top of the substrate as illustrated in the FIGURES, the cap may have a composition that is identical to the internal layer vias. Alternatively, the cap may have a composite composition of glass ceramic and metallic material with the maximum glass ceramic content at about 50 volume %. When the caps are at the bottom of the substrate as illustrated in the FIGURES, the cap has a composition that is a mixture of glass ceramic and metallic material.

At a minimum, the cap preferably has about 6 volume % glass ceramic, perhaps as low as 4 volume %, to ensure proper densification characteristics. The maximum glass ceramic content may go as high as that in the sealing layer composite vias, which as noted above is 40 to 90 volume %.

The purposes and advantages of the present invention will become more apparent after referring to the following Examples.

Examples

A number of MLC glass ceramic substrates were fabricated in order to demonstrate the effectiveness of the invention.

The green (unsintered) glass ceramic laminates were prepared in the conventional way such as that disclosed in Herron et al. U.S. Pat. No. 4,234,367. The laminates had a total of 69 layers. The top four and bottom four layers were sealing layers and had vias filled with a paste consisting of, based on the volume of the solids, 40 volume % copper (particle size predominantly 0.6–1.5 microns) and 60 volume % crystallizable glass (average particle size 3.5 microns). The paste also included conventional binders, flow control agents, etc.

In seven of the laminates, a cap of composite material was deposited (two pass screened) on the breakout side of the vias in the fourth sealing layer. The composite paste material had a composition, based on the volume % of the solids, 55 volume % copper (particle size predominantly 5.1–7.5 microns) and 45 volume % crystallizable glass (average particle size 3.5 microns).

In eight of the laminates, a cap of composite material was deposited (double sided screened) on the non-breakout side of the first internal layer after the top four sealing layers. The composition of the composite cap material was as just described above in the seven laminates.

In another seven of the laminates, the vias of the fifth layer (the first after the top four sealing layers) were filled with a composite paste of 55 volume % copper and 45 volume % crystallizable glass, as was described above. On the breakout side of this layer, a metallic cap was deposited (two pass screened) on the vias. The composition of the metallic cap was copper (particle size predominantly 5.1–7.5 microns) with the copper particles coated with anywheres from 0–400 ppm alumina. Although the composition of the via is not the most preferred for a sealing via, it could nevertheless perform that function in these substrates.

Finally, in 100 of the laminates, a cap of composite material was deposited (double sided screened) on the non-breakout side of the metallic (copper) vias in one of the internal layers near the middle of the laminate. The composite material was the 55 volume % copper, 45 volume % crystallizable glass discussed above.

The crystallizable glass for all the laminates was selected from Table I.

The laminates were then sintered according to the following schedule. The temperature was ramped up to 705°–725° in an atmosphere of wet $N_2$ followed by binder burnoff in a steam ambient. Subsequently, the atmosphere was replaced with a forming gas atmosphere and then the temperature was ramped up to 975° C. in $N_2$. The atmosphere was then changed to a steam ambient and heating at 975° C. continued. The laminates were then cooled down, first in the steam ambient and then in $N_2$.

After sintering, all the substrates were sectioned and examined. It was determined that all the interfaces containing the cap material showed good bonding and structural integrity. It is thus believed that interposing a cap of material between the sealing layer and the internal layer is effective in making the transition from the sealing layer to the internal layer less stressful, thereby lessening the likelihood of opens.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayer ceramic substrate for electronic applications comprising:
   (a) at least one internal layer having vias at least partially filled with a metallic material;
   (b) at least one sealing layer having vias at least partially filled with a composite material that is a mixture of ceramic and metallic materials wherein at least one via from the internal layer is aligned with at least one via from the sealing layer; and
   (c) a cap of material interposed between the aligned vias wherein the cap of material is selected from the group of materials consisting of a metallic material and a composite material that is a mixture of ceramic and metallic materials and wherein the cap material is a composite material and has an amount of ceramic material that is equal to or less than that in the sealing layer vias.

2. A multilayer ceramic substrate for electronic applications comprising:
   (a) at least one internal layer having vias at least partially filled with a metallic material;
   (b) at least one sealing layer having vias at least partially filled with a composite material that is a mixture of ceramic and metallic materials wherein at least one via from the internal layer is aligned with at least one via from the sealing layer; and
   (c) a cap of material interposed between the aligned vias wherein the cap of material is selected from the group of materials consisting of a metallic material and a composite material that is a mixture of ceramic and metallic materials and wherein the cap material is a composite material that has less ceramic and more metallic material than the sealing layer vias and less metallic material than the internal layer vias.

3. The ceramic substrate of claim 1 further comprising:
   at least one additional internal layer having at least one via aligned with a via on an adjacent internal layer; and
   at least one additional cap of material interposed between the aligned vias of the adjacent internal layers.

4. The ceramic substrate of claim 1 wherein the ceramic substrate further comprises a top surface and a bottom surface and each of the top and bottom surfaces comprise at least internal and sealing layers with the cap material therebetween and with the layers arranged so that the internal layers are internal to the ceramic substrate and the sealing layers are toward the outer periphery of the ceramic substrate.

5. The ceramic substrate of claim 1 wherein there are a plurality of internal layers.

6. The ceramic substrate of claim 1 wherein there are a plurality of sealing layers.

7. The ceramic substrate of claim 1 wherein there are a plurality of layers containing the capping material.

8. A multilayer glass ceramic substrate for electronic applications comprising:
(a) at least one internal layer having vias at least partially filled with a metallic material;
(b) at least one sealing layer having vias at least partially filled with a composite material that is a mixture of glass ceramic and metallic materials wherein at least one via from the internal layer is aligned with at least one via from the sealing layer; and
(c) a cap of material interposed between the aligned vias wherein the cap of material is selected from the group of materials consisting of a metallic material and a composite material that is a mixture of ceramic and metallic materials and wherein the cap material is a composite material and has an amount of glass ceramic material that is equal to or less than that in the sealing layer vias.

9. A multilayer glass ceramic substrate for electronic applications comprising:
(a) at least one internal layer having vias at least partially filled with a metallic material;
(b) at least one sealing layer having vias at least partially filled with a composite material that is a mixture of glass ceramic and metallic materials wherein at least one via from the internal layer is aligned with at least one via from the sealing layer; and
(c) a cap of material interposed between the aligned vias wherein the cap of material is selected from the group of materials consisting of a metallic material and a composite material that is a mixture of ceramic and metallic materials and wherein the cap material is a composite material that has less glass ceramic and more metallic material than the sealing layer vias and less metallic material than the internal layer vias.

10. The ceramic substrate of claim 8 further comprising:
at least one additional internal layer having at least one via aligned with a via on an adjacent internal layer; and
at least one additional cap of material interposed between the aligned vias of the adjacent internal layers.

11. The ceramic substrate of claim 10 wherein the internal layer vias contain a ceramic material and wherein the ceramic material in the internal layer vias is glass ceramic.

12. The ceramic substrate of claim 10 wherein the internal layer vias contain a ceramic material and wherein the ceramic material in the internal layer vias is glass ceramic.

13. The ceramic substrate of claim 8 wherein the ceramic substrate further comprises a top surface and a bottom surface and each of the top and bottom surfaces comprise at least internal and sealing layers with the cap material therebetween and with the layers arranged so that the internal layers are internal to the ceramic substrate and the sealing layers are toward the outer periphery of the ceramic substrate.

14. The ceramic substrate of claim 8 wherein there are a plurality of internal layers.

15. The ceramic substrate of claim 8 wherein there are a plurality of sealing layers.

16. The ceramic substrate of claim 8 wherein there are a plurality of layers containing the capping material.

17. The ceramic substrate of claim 8 wherein the via composition of the sealing layer vias comprises 40 to 90 volume % glass ceramic and 60 to 10 volume % metallic material.

18. The ceramic substrate of claim 17 wherein the metallic material is copper.

19. The ceramic substrate of claim 8 wherein the composition of the capping material comprises at least about 6 volume % glass ceramic material.

20. The ceramic substrate of claim 8 wherein the glass ceramic material comprises cordierite.

21. A method of fabricating a multilayer ceramic substrate for electronic applications, the method comprising the steps of:
providing at least one unsintered internal layer having vias at least partially filled with a metallic material;
providing at least one unsintered sealing layer having vias at least partially filled with a composite material that is a mixture of ceramic and metallic materials;
depositing a cap of material on at least one via of the internal layer or screening layer wherein the cap of material is selected from the group of materials consisting of a metallic material and a composite material that is a mixture of ceramic and metallic materials and wherein the cap material is a composite material and has an amount of ceramic material that is equal to or less than that in the sealing layer vias;
stacking the internal and sealing layers so that at least one via from the internal layer is aligned with at least one via from the sealing layer and the cap of material is between the aligned vias; and
sintering the internal and sealing layers to form a multilayer ceramic substrate.

22. The method of claim 21 wherein the cap of material is deposited on at least one internal layer via.

23. The method of claim 22 wherein the internal layer vias are filled from one side of the layer and the cap of material is deposited on the at least one via from that one side.

24. The method of claim 22 wherein the internal layer vias are filled from one side of the layer and the cap of material is deposited on the at least one via from the opposite side.

25. The method of claim 21 wherein the cap of material is deposited on at least one sealing layer via.

26. The method of claim 25 wherein the sealing layer vias are filled from one side of the layer and the cap of material is deposited on the at least one via from that one side.

27. The method of claim 25 wherein the sealing layer vias are filled from one side of the layer and the cap of material is deposited on the at least one via from the opposite side.

28. A method of fabricating a multilayer ceramic substrate for electronic applications, the method comprising the steps of:
providing at least one unsintered internal layer having vias at least partially filled with a metallic material;
providing at least one unsintered sealing layer having vias at least partially filled with a composite material that is a mixture of ceramic and metallic materials;
depositing a cap of material on at least one via of the internal layer or screening layer wherein the cap of material is selected from the group of materials consisting of a metallic material and a composite material that is a mixture of ceramic and metallic materials and wherein the cap material is a composite material and has less ceramic and more metallic material than the sealing layer vias and less metallic material than the internal layer vias;

stacking the internal and sealing layers so that at least one via from the internal layer is aligned with at least one via from the sealing layer and the cap of material is between the aligned vias; and sintering the internal and sealing layers to form a multilayer ceramic substrate.

29. The method of claim 21 wherein the ceramic substrate further comprises a top surface and a bottom surface and each of the top and bottom surfaces comprise at least internal and sealing layers with the cap material therebetween and with the layers arranged so that the internal layers are internal to the ceramic substrate and the sealing layers are toward the outer periphery of the ceramic substrate.

30. The method of claim 21 wherein there are a plurality of internal layers.

31. The method of claim 21 wherein there are a plurality of sealing layers.

* * * * *